United States Patent
Hempelmann et al.

(10) Patent No.: US 9,274,440 B2
(45) Date of Patent: Mar. 1, 2016

(54) ARRANGEMENT FOR AND METHOD OF CHARACTERISING THE POLARIZATION PROPERTIES OF AN OPTICAL SYSTEM

(75) Inventors: Uwe Hempelmann, Aalen (DE); Markus Mengel, Heidenheim (DE); Peter Huber, Holzschwang (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 648 days.

(21) Appl. No.: 13/560,916

(22) Filed: Jul. 27, 2012

(65) Prior Publication Data

US 2013/0021592 A1 Jan. 24, 2013

Related U.S. Application Data

(63) Continuation of application No. PCT/EP2010/068713, filed on Dec. 2, 2010.

(30) Foreign Application Priority Data

Jan. 28, 2010 (DE) .......................... 10 2010 001 336

(51) Int. Cl.
   *G03B 27/72* (2006.01)
   *G03F 7/20* (2006.01)
(52) U.S. Cl.
   CPC .......... *G03F 7/7085* (2013.01); *G03F 7/70566* (2013.01)
(58) Field of Classification Search
   CPC ........................... G03F 7/7085; G03F 7/70566
   USPC ................................................ 355/67, 53, 71
   See application file for complete search history.

(56) References Cited

U.S. PATENT DOCUMENTS

| 3,833,289 A | 9/1974 | Schuler |
| 5,867,239 A | 2/1999 | Sahouani et al. |
| 6,219,121 B1 | 4/2001 | Sahouani et al. |

(Continued)

FOREIGN PATENT DOCUMENTS

| CN | 1338644 A | 3/2002 |
| CN | 1584536 A | 2/2005 |

(Continued)

OTHER PUBLICATIONS

Office Action in corresponding Japanese Application No. 2012-550339, dated Oct. 22, 2013, along with an English translation.

(Continued)

*Primary Examiner* — Peter B Kim
(74) *Attorney, Agent, or Firm* — Edell, Shapiro & Finnan, LLC

(57) ABSTRACT

An arrangement for and a method of characterizing the polarization properties of an optical system, in particular an optical system of a microlithographic projection exposure apparatus. The arrangement includes at least one polarization state generator (130, 230, 330) which sets a defined polarization state of radiation incident on the optical system, and a polarization state detector (140, 240, 340) adapted to measure the exit polarization state of radiation issuing from the optical system, wherein the optical system is designed for a working wavelength of less than 15 nm, and wherein the polarization state generator and/or the polarization state detector are so designed that their polarization-optical action on an incident light beam is substantially constant over an angle spectrum of the light beam of at least 10°.

23 Claims, 12 Drawing Sheets

(56) References Cited

U.S. PATENT DOCUMENTS

| | | | |
|---|---|---|---|
| 6,280,906 | B1 | 8/2001 | Braat et al. |
| 6,389,107 | B1 | 5/2002 | Kantsyrev et al. |
| 6,859,263 | B2 | 2/2005 | Naulleau |
| 6,999,172 | B2 | 2/2006 | Masaki et al. |
| 7,027,164 | B2 | 4/2006 | Gontin et al. |
| 7,268,945 | B2 | 9/2007 | Yun et al. |
| 7,277,182 | B2 | 10/2007 | Wegmann et al. |
| 7,286,245 | B2 | 10/2007 | Wegmann et al. |
| 7,375,799 | B2 | 5/2008 | Van De Kerkhof et al. |
| 7,581,832 | B2 | 9/2009 | Begon et al. |
| 2002/0171922 | A1 | 11/2002 | Shiraishi et al. |
| 2003/0234993 | A1 | 12/2003 | Hazelton et al. |
| 2004/0114150 | A1 | 6/2004 | Wegmann et al. |
| 2006/0011850 | A1 | 1/2006 | Seely |
| 2007/0008517 | A1 | 1/2007 | Fomenkov et al. |
| 2008/0062385 | A1 | 3/2008 | Klaassen |
| 2008/0062427 | A1 | 3/2008 | Ohsaki et al. |
| 2008/0073572 | A1 | 3/2008 | Schwarzl et al. |
| 2008/0192225 | A1 | 8/2008 | Mann et al. |
| 2009/0201480 | A1 | 8/2009 | Arai |
| 2009/0213356 | A1 | 8/2009 | Gruner et al. |
| 2010/0045956 | A1 | 2/2010 | Van De Kerkhof et al. |

FOREIGN PATENT DOCUMENTS

| | | |
|---|---|---|
| CN | 1973243 A | 5/2007 |
| CN | 101233455 A | 7/2008 |
| CN | 101389985 A | 3/2009 |
| EP | 1376237 A2 | 1/2004 |
| EP | 1462780 A1 | 9/2004 |
| EP | 1574904 A1 | 9/2005 |
| JP | 2006237617 A | 9/2006 |
| JP | 2007281463 A | 10/2007 |
| JP | 2008098604 A | 4/2008 |
| JP | 2008538452 A | 10/2008 |
| JP | 2008547190 A | 12/2008 |
| JP | 2009278133 A | 11/2009 |
| TW | 200949455 A | 12/2009 |
| WO | 2004066366 A2 | 8/2004 |
| WO | 2005119349 A2 | 12/2005 |
| WO | 2006002859 A2 | 1/2006 |
| WO | 2006111319 A2 | 10/2006 |
| WO | 2006117122 A1 | 11/2006 |
| WO | 2006133906 A1 | 12/2006 |
| WO | 2008022680 A1 | 2/2008 |
| WO | 2009052932 A1 | 4/2009 |

OTHER PUBLICATIONS

Office Action in corresponding Korean Application No. 10-2012-7017028, dated Mar. 25, 2014, along with an English translation.

Office Action in corresponding German Application No. 102010001336.6-52, dated Aug. 17, 2010, along with an English translation.

Office Action in corresponding Chinese Application No. 201080061827.3, dated Feb. 8, 2014, along with an English translation.

B. Kjornrattanawanch, et al., "Mo/B4C/Si miltilayer-coated photodiode with polarization sensitivity at an extreme-ultraviolet wavelength of 13.5 nm", Applied Optics, vol. 43, No. 5, Feb. 10, 2004.

M. Tan et al., "Design of transmission multilayer polarizer for soft X-ray using a merit function", Optics Express, vol. 17, No. 4, Feb. 16, 2009.

Polarimeter soft X-ray 8 axes diffractometer, Nov. 20, 2007, www.bessy.de/bit/upload/polarimeter/pdf.

M. Ravet, et al., "B/Si multilayers for soft x-ray and extreme ultraviolet optics", Journal of Applied Physics, vol. 89, No. 2, Jan. 15, 2001.

F. Schaefers et al., "Soft x-ray polarimeter with multilayer optics: complete analysis of the polarization state of light", Applied Optics, vol. 38, No. 19, Jul. 1, 1999.

H. Wang et al., "Design of the Broad Angular Multilayer Analyzer for Soft X-Ray and Extreme Ultraviolet", Proc. 8th Int. Conf. X-ray Microscopy, IPAP Conf. Series 7, pp. 177-179, 2004.

Z. Wang et al., "Broadband multilayer polarizers for the extreme ultraviolet", Journal of Applied Physics, vol. 99, No. 5, Mar. 15, 2006.

Z. Wang et al., "Extreme ultraviolet broadband Mo/Y multilayer analyzers", Applied Physics Letters, vol. 89, No. 24, Dec. 14, 2006.

M. Yamamoto et al., "Polarization performance of EUV transmission multilayers as lambda/4 and lambda/2 playes at a photon energy of 97 eV" Journal of Electron Spectroscopy and Related Phenomena, vol. 101-103, Jun. 1, 1999.

F. Scholze et al., "Polarization dependence of multilayer reflectance in the EUV spectrla range", Emerging Lithographic Technologies X, Proc. of SPIE vol. 6151, 615137, 2006.

M. Yamamoto, "Polarimetry with use of soft x-ray multilayers", SPIE vol. 2010 X-Ray and Ultraviolet Polarimetry, 1993.

M. Yamamoto, et al., "Thin film ellipsometry at a photon energy of 97eV", Journal of Electron Spectroscopy and Related Phenomena, vol. 80, 1996.

Y. Hasegawa et al., "Transmission-type X-ray linear polarizer with perfect crystals", J. Synchrotron Rad., vol. 5, 1998.

R. Azzam, "Ellipsometry: a sophisticated tool for optical metrology", Proc. of SPIE, vol. 4099, 2000.

Z. Wang et al., "Complete polarization analysis of extreme ultraviolet radiation with a broadband phase retarder and analyzer", Appl. Phys. Lett. 90, 2007.

Office Action in corresponding Taiwanese Application No. 100103062, dated Oct. 22, 2015, along with an English translation.

Angle of incidence on layer [°]

Angle of incidence on layer [°]

ARRANGEMENT FOR AND METHOD OF CHARACTERISING THE POLARIZATION PROPERTIES OF AN OPTICAL SYSTEM

The present application is a Continuation of International Application No. PCT/EP2010/068713, filed on Dec. 2, 2010, which claims priority of German Patent Application 10 2010 001 336.6, filed on Jan. 28, 2010. The contents of these applications are hereby incorporated by reference in their respective entireties.

FIELD AND BACKGROUND OF THE INVENTION

The invention concerns an arrangement for and a method of characterising the polarisation properties of an optical system.

Microlithography is used for the production of microstructured components such as for example integrated circuits or LCDs. The microlithography process is carried out in what is referred to as a projection exposure apparatus having an illumination system and a projection objective. In that case the image of a mask (=reticle) illuminated by the illumination system is projected by the projection objective on to a substrate (for example a silicon wafer) which is coated with a light-sensitive layer (photoresist) and arranged in the image plane of the projection objective in order to transfer the mask structure on to the light-sensitive coating on the substrate.

It is known that, in high-resolution imaging systems such as for example the above-described microlithographic projection exposure apparatus, particularly with high numerical apertures, the influence of the imaging system on the polarisation state of the radiation which in operation passes through the imaging system can no longer be disregarded. That is to be attributed to changes in the imaging contrast due to polarisation-influencing effects (for example stress birefringence induced by holder components in the material of the optical components such as for example lenses or mirrors, polarisation-influencing effects of dielectric layers and so forth).

It is thus desirable to determine the polarisation properties of such imaging systems, in particular of high aperture, as reliably as possible, in order on the one hand to draw appropriate conclusions concerning the polarisation-dependent imaging quality, and on the other hand to be able to take possibly suitable measures for manipulation of the polarisation properties.

U.S. Pat. No. 7,286,245 B2 discloses inter alia a method of and an apparatus for determining the influence of the polarisation state of optical radiation by an optical imaging system, wherein a defined entrance polarisation state is afforded in an object plane of the imaging system and wherein the exit polarisation state of radiation issuing from the imaging system is measured in pupil-resolved relationship within a predeterminable pupil region of the imaging system. The imaging system can be for example a projection objective of a projection exposure apparatus designed for the wavelength range around 248 nm or 193 nm.

Mirrors are used as optical components for the imaging process in projection objectives designed for the EUV range, that is to say at wavelengths of for example about 13 nm or about 7 nm, due to the lack of availability of suitable translucent refractive materials. In that case the problem which arises in connection with the above-mentioned characterisation of the polarisation properties is that the implementation of a measurement structure like that described hereinbefore using reflective optical components can lead to considerable problems in regard to the required structural space, going as far as lack of viability.

OBJECTS AND SUMMARY OF THE INVENTION

An object of the present invention is to provide an arrangement for and a method of characterising the polarisation properties of an optical system, which permit reliable characterisation of the polarisation properties even at working wavelengths in the EUV, and preferably with a compact structure.

An arrangement for characterising the polarisation properties of an optical system, in particular an optical system of a microlithographic projection exposure apparatus, comprises:
  at least one polarisation state generator which sets a defined polarisation state of radiation incident on the optical system; and
  a polarisation state detector adapted to measure the exit polarisation state of radiation issuing from the optical system;
  wherein the optical system is designed for a working wavelength of less than 15 nm; and
  wherein the polarisation state generator and/or the polarisation state detector are so designed that their polarisation-optical action on an incident light beam is substantially constant over an angle spectrum of said light beam of at least 10°.

The criterion whereby 'the polarisation-optical action' of the polarisation state generator and/or the polarisation state detector on an incident light beam is constant signifies that the polarisation state generator or polarisation state detector produce the same polarisation state over said angle spectrum, which in turn can be defined in that, for the light issuing from the polarisation state generator and/or polarisation state detector, the so-called IPS value (='intensity in preferred state') is constant over said angle spectrum if the IPS value is constant for the light incident in the polarisation state generator or the polarisation state detector. In that respect the expression 'substantially constant' is also intended to embrace fluctuations in the IPS value of up to 10%, in particular up to 5%. In addition the desired polarisation state is not necessarily linear polarisation but can also be any other polarisation state, for example elliptical or circular polarisation.

With the arrangement according to the invention, the invention pursues in particular the concept of designing the components used for characterising the polarisation state, the polarisation state generator and the polarisation state detector, respectively for operation in the transmission mode at working wavelengths in the EUV range. In accordance with another approach the polarisation state generator and/or the polarisation state detector have at least one optical element which is operated in the transmission mode. In that way once again particularly in optical systems with a working wavelength of about 13.5 nm, a markedly more compact structure is achieved as reflecting polarisation-optical components with comparatively complicated beam paths and more complex and expensive actuators are avoided.

In that respect it is to be noted in particular that the option which exists in the DUV wavelength range, that is to say at wavelengths of for example about 248 nm or about 193 nm, of being able to operate the polarisation-optical components in a parallel beam geometry (that is to say with mutually parallel beam portions of the beam which passes through the respective component) is no longer afforded in the EUV range embraced in accordance with the invention as none of the suitable optical components used in the DUV range, in the form of lens systems, are now available to transform the divergent or convergent beam path into a parallel beam path.

A further advantage of the configuration according to the invention is that the components operated in the transmission mode can be relatively easily incorporated at the respectively appropriate positions in the beam path without a significant change in the beam path being required for that purpose.

Furthermore, in accordance with the invention, in spite of the above-mentioned divergent or convergent beam paths, it is possible to implement simultaneous or parallel measurement of the exit polarisation state of radiation issuing from the optical system. That means that the exit pupil of the system is measured 'all at once', that is to say beams are simultaneously passed with larger aperture angles through the respective polarisation-optical component or are detected by a detector element at the end of the arrangement such as for example a CCD camera. That is advantageous insofar as scanning of the exit pupil—which is usual in conventional measurement operations for the polarisation properties in EUV—and in which a comparatively narrow parallel beam has to be 'displaced' successively over the entire angular range to perform successive individual measurements is dispensable. Besides the time advantages resulting from simultaneous measurement that affords further advantages in terms of avoiding positioning problems and drift errors.

Although an advantageous use of the invention is measurement of the polarisation properties of a projection objective the invention is not limited thereto. Rather, the term 'optical system', the polarisation properties of which are characterised in accordance with the invention, also embraces any other optical systems and in particular also individual optical elements such as for example mirrors.

In an embodiment the polarisation state generator and/or the polarisation state detector are so designed that their polarisation-optical action on an incident light beam is substantially constant over an angle spectrum of that light beam of at least 15°, in particular at least 20°, and further particularly over the entire angle spectrum of said light beam.

In an embodiment the polarisation state generator is adapted for pupil-resolved measurement of the exit polarisation state. In that respect the values implemented for pupil resolution can be for example at least 30 pixels, in particular at least 40 pixels, further particularly at least 50 pixels, over the pupil radius.

In an embodiment the polarisation state generator and/or the polarisation state detector has a rotatable polariser. In addition the polarisation state generator and/or the polarisation state detector can have a rotatable retarder.

In an embodiment the polariser and/or the retarder has at least one multi-layer system having a plurality of individual layers. Preferably in that respect the multi-layer system has a light entrance surface which is at least region-wise curved, i.e., curved at least in regions along the surface. In accordance with the invention that can be implemented in particular by the multi-layer system being of a varying thickness. In a further embodiment the plurality of individual layers can also be disposed on a substrate which is at least region-wise curved.

In an embodiment the plurality of individual layers is arranged either in free-standing or substrate-less relationship or on a substrate of a thickness of a maximum of 400 nm, preferably a maximum of 100 nm, and further preferably a maximum of 50 nm to achieve a sufficiently large proportion of the transmitted light. Suitable substrate materials to be considered are in particular those of comparatively low transmission, for example silicon (Si), quartz glass (=fused silica, $SiO_2$), silicon nitride ($Si_3N_4$), silicon carbide (SiC), polymers, quartz ($SiO_2$,), zirconium (Zr), diamond, niobium (Nb) and molybdenum (Mo).

In an embodiment the polariser and/or the retarder can also have a plurality of substrates each provided with a multi-layer system. In that respect at least two of those substrates (in particular also all of those substrates) can be arranged tilted relative to each other to provide the arrangement consisting of the substrates respectively provided with the multi-layer system with the desired homogeneity of the polarisation-influencing action in the angle spectrum.

In an embodiment the respective polariser produces a linear exit polarisation degree of radiation issuing from the polariser of at least 95%, in particular at least 97%, further particularly at least 99%. In that respect the expression 'linear exit polarisation degree' is used to denote the ratio of the intensity of the linearly polarised light component to the total intensity of the light, which ratio applies for the light issuing from the respective polariser.

In an embodiment the arrangement further has a wavelength filter which again is preferably adapted to filter a predetermined wavelength band out of the wavelength spectrum of the light source in the (measurement) arrangement. That is advantageous in regard to the fact that, in a projection exposure apparatus designed for EUV, the transmission bandwidth of the projection objective is comparatively great at about 13.5±0.3 nm and is also exceeded by the bandwidth of the plasma light source used as the light source for the illumination system.

Measurement involving integration over those relatively wideband wavelength ranges could not be readily transferred to the actual operating characteristics of the projection objective if the spectra of the plasma light source used in the measurement operation and the plasma light source used in the actual lithography procedure are not the same. In contrast, by using the wavelength filter (which is sufficiently narrowband, for example involving a bandwidth of at most ½0 of the transmission bandwidth of the projection objective), it is possible to provide for a wavelength-resolved measurement in order to be able to make a prediction of the polarisation properties of the projection objective for the respective entrance spectrum.

In an embodiment the optical system is designed for a numerical aperture of at least 0.3, in particular at least 0.5, further particularly at least 0.7. With increasing apertures the invention is particularly advantageous as then overcoming the problems involved with the larger aperture angles which occur in the exit pupil is particularly useful.

The invention further concerns an apparatus for EUV lithography comprising a projection objective designed for operation in the EUV and an arrangement for characterising the polarisation properties of said projection objective, wherein that arrangement is designed like the above-described arrangement for characterising the polarisation properties of an optical system.

Furthermore the invention concerns a method of characterising the polarisation properties of an optical system, in particular an optical system of a microlithographic projection exposure apparatus, wherein the method comprises the following steps:

setting a defined polarisation state of radiation incident on the optical system with a polarisation state generator; and measuring the exit polarisation state of radiation issuing from the optical system with a polarisation state detector;

wherein the optical system is designed for a working wavelength of less than 15 nm; and wherein the polarisation state generator and/or the polarisation state detector have at least one optical element operated in the transmission mode.

Further configurations of the invention are found in the description and the appendant claims. The invention is described in greater detail hereinafter by means of preferred embodiments by way of example with reference to the accompanying drawings.

DETAILED DESCRIPTION OF EXEMPLARY EMBODIMENTS

Figure 1:
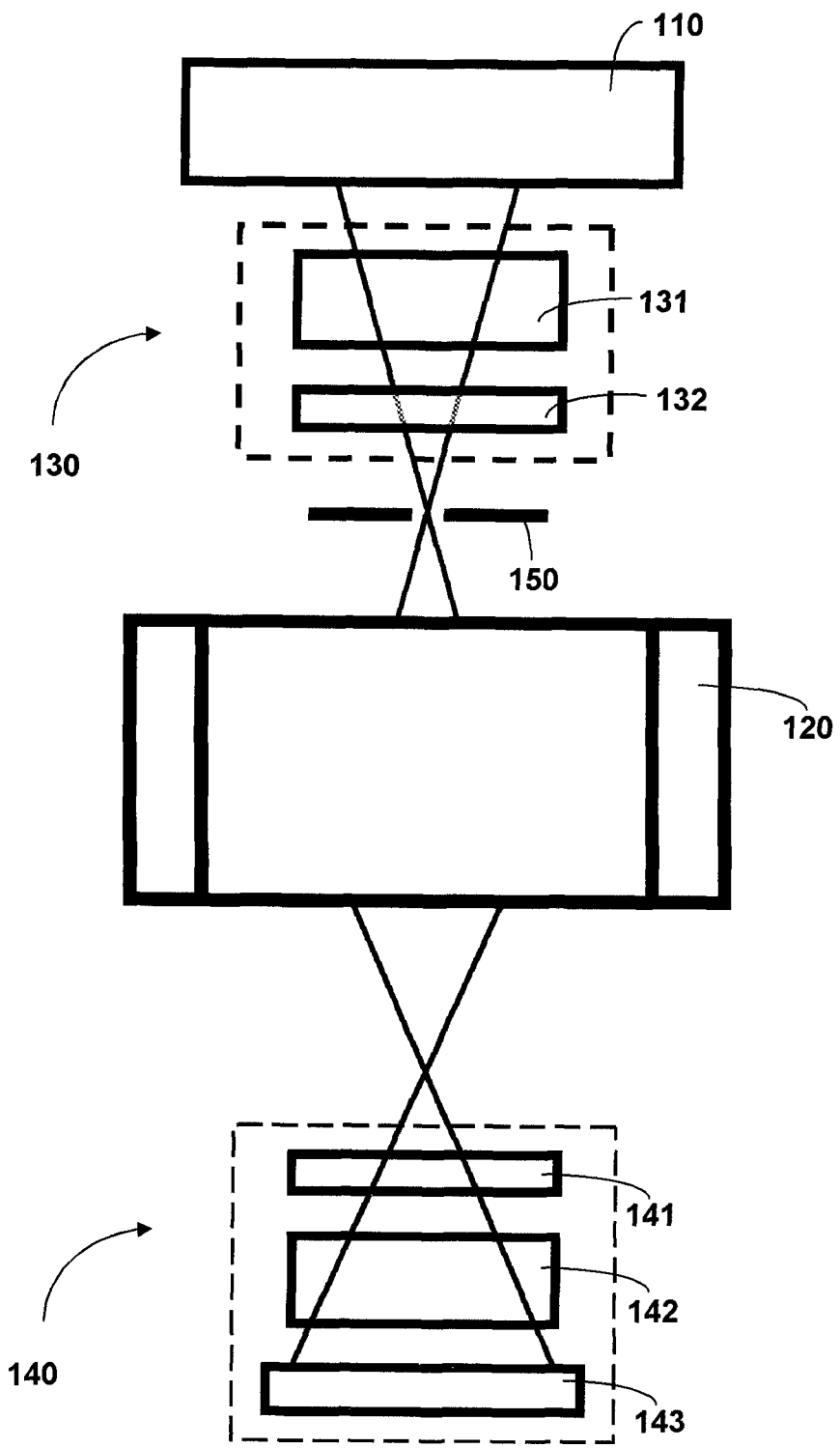
FIG. 1 is a diagrammatic view to illustrate the structure of an arrangement according to the invention for characterising the polarisation properties in a first embodiment.

FIG. 1 firstly shows a diagrammatic view of a possible measurement structure using an arrangement according to the invention. The arrangement serves for characterising the polarisation properties of a projection objective 120 which is designed for operation in the EUV range and which with an illumination system 110 also designed for EUV forms a microlithographic projection exposure apparatus.

The method implemented using the measurement structure shown in FIG. 1 is known as such from U.S. Pat. No. 7,286,245 B2 for wavelengths in the DUV range (for example about 193 nm or about 248 nm). The subject-matter of the present application is however the use of that method in the EUV range, that is to say at wavelengths below 15 nm, wherein account is taken of the problems arising in that use as explained hereinafter by a suitable design configuration of the polarisation-optical components. More precisely the method according to the invention is distinguished by the use of wideband polarisation-optical components both in respect of the wavelength spectrum and also in respect of the angle spectrum.

In that respect the invention pursues in particular the concept of using the polarisation-optical components in the transmission mode in spite of the use in the EUV range and thus avoiding reflecting polarisation-optical components with comparatively complicated beam paths and also more complex and expensive actuators.

As shown in FIG. 1 the arrangement according to the invention includes, in the light propagation direction, downstream of the illumination system 110, a polarisation state generator 130 which has in succession in the light propagation direction a rotatable polariser 131 and a rotatable retarder 132. The configuration of the polariser 131 and the retarder 132 is described in greater detail hereinafter with reference to FIGS. 4-6.

The polariser 131 is preferably so designed that it produces a polarisation state which is linear at least to a good level of approximation, wherein the preferred polarisation direction is variable by rotation of the polariser 131. The production of light which is polarised linearly as completely as possible by the polariser 131 also provides for maximising the light contribution to the operation of determining the polarisation state, which takes place in the further procedure in the polarisation state detector 140 (whereas a non-polarised light component which remains on issuing from the polariser 131 would not contribute to the measurement procedure according to the invention).

The retarder 132 preferably has an effective retardation of a quarter of the working wavelength λ of the system (that is to say for example (13.5/4) nm), in which case the polarisation state generator 130 makes it possible to set any (including circular) polarisation states. The polarisation state generator 130 accordingly thus makes it possible to set different elliptical polarisation states in the entrance pupil of the projection objective 120.

Disposed downstream of the polarisation state generator 130 in the light propagation direction is an apertured mask 150 (=pinhole) which approximately forms a point light source in the (entrance) field plane of the projection objective 120.

The light from the pinhole 150 then passes through the projection objective 120, wherein the angles of the beam portions coming from the point light source formed by the pinhole 150 correspond to positional co-ordinates in the pupil plane (not shown) of the projection objective 120, which in turn are imaged at an angle in the exit pupil of the projection objective 120. Polarisation distribution over that exit pupil, that is to say the exit polarisation state of the light issuing from the projection objective 120, is ascertained in pupil-resolved relationship with a polarisation state detector 140. That operation of determining the exit polarisation state is effected in a manner which is basically also known, simultaneously over the exit pupil, that is to say the exit pupil of the system is measured 'all at once', insofar as beams are also simultaneously passed at relatively large aperture angles through the respective polarisation-optical component, or are detected by a detector element at the end of the arrangement such as for example a CCD camera.

For that purpose the polarisation state detector 140 in turn has a rotatable retarder 141 and downstream thereof in the light propagation direction a polariser 142 which is preferably also rotatable as well as a detector element 143 for example in the form of a CCD camera. Accordingly the CCD camera measures the distorted projection image of the exit pupil of the projection objective 120.

The retarder 141 preferably also has a retardation corresponding to a quarter of the working wavelength (=lambda/4). That affords an optimum signal-to-noise ratio in the measurement operation as then the variation in intensity which occurs on the detector element 143 or the CCD camera during the measurement operation becomes a maximum in dependence on the rotary position of the retarder 141 and the polarisation properties of the projection objective 120.

An important property of the illustrated arrangement is now that the light is incident on the polarisation-optical components in the polarisation state detector 140 and also in the polarisation state generator 130, at different angles of incidence, since, as already explained in the opening part of this specification, the lens systems usual in the DUV range are not available for converting a divergent beam path into a parallel beam path. In accordance with the invention the problems arising out of the inclined passage of light both on the part of the polarisation state generator 130 and also on the part of the polarisation state detector 140 are resolved by a suitable design in respect of the polarisation-optical components, as is described in greater detail hereinafter with reference to FIGS. 4-6.

The measurement structure described hereinbefore with reference to FIG. 1 makes it possible to determine the polarisation properties of any optical system. Simplified measurement structures for characterising optical systems with more specific polarisation properties are described hereinafter with reference to FIG. 2 and FIG. 3.

Figure 2:
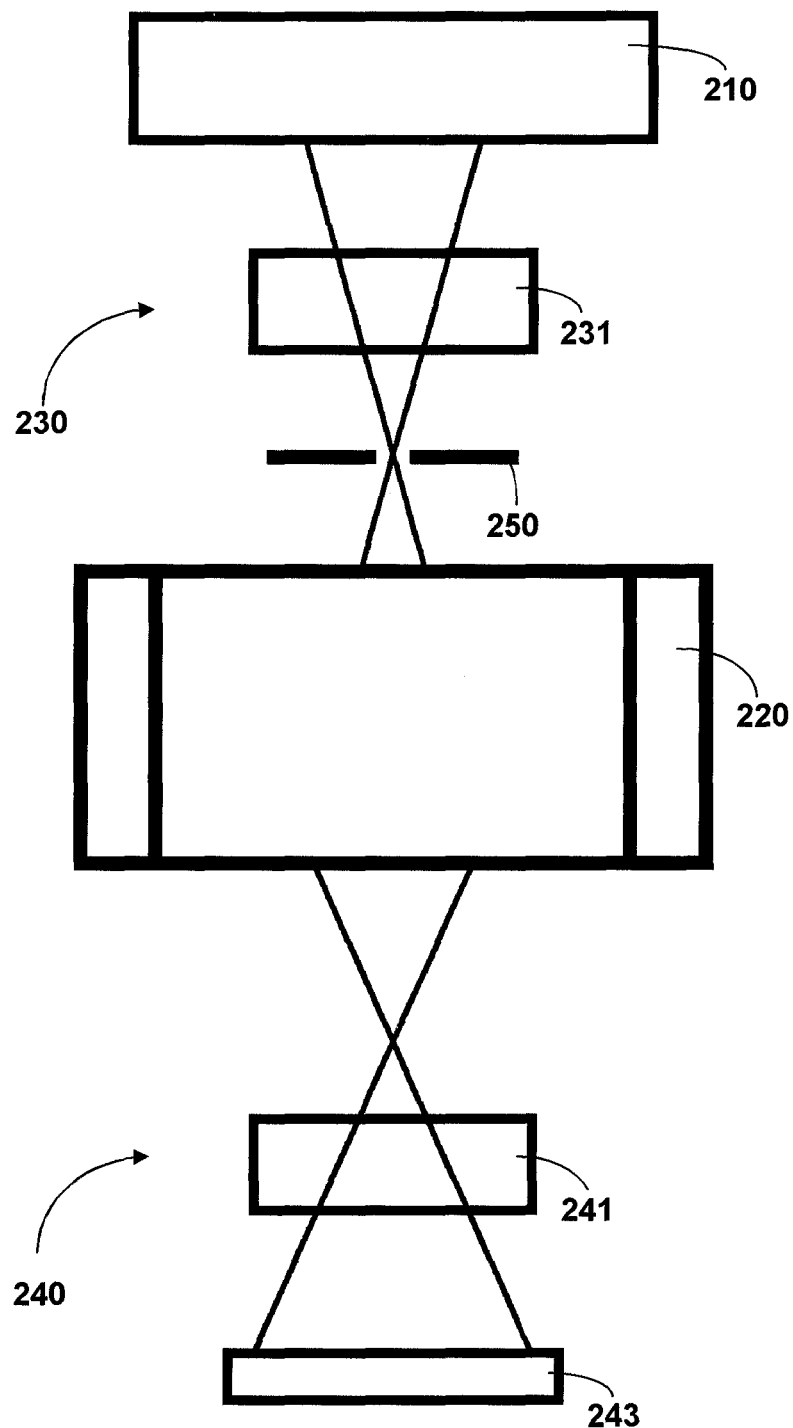
FIGS. 2-3 show diagrammatic views to illustrate further embodiments of the invention which are simplified in relation to FIG. 1, FIGS. 4a-c show diagrammatic views to illustrate embodiments by way of example of multi-layer systems used in an arrangement as shown in FIGS. 1-3, FIGS. 5-6 show diagrammatic views to illustrate further embodiments of multi-layer systems according to the invention.

FIG. 2 shows an embodiment which is an alternative to the measurement structure in FIG. 1, wherein mutually corresponding components or components of substantially the same function are denoted by references increased by '100'.

The measurement structure in FIG. 2 differs from that in FIG. 1 in that the polarisation state generator 230 or the polarisation state detector 240 respectively each has only a rotatable polariser 231 and 241 respectively, but no retarder. Such a structure which is simplified in comparison with FIG. 1 is suitable for determining the polarisation properties of a projection objective 230, whose pupil Jones matrices in a good approximation have exclusively linearly polarised eigen polarisations.

The polarisers 231 and 241 can either be oriented in mutually crossed relationship (to produce a dark-field polarimeter) or in mutually parallel relationship (to produce a light-field polarimeter) and rotate synchronously with each other about the optical axis of the projection objective 230. During that rotation measurement is made by means of the detector element 143 or the CCD camera of the variation in intensity, from which in turn polarisation properties, namely retardation (that is to say the phase difference between two orthogonal polarisation states) and diattenuation (that is to say the ratio of the amplitudes between two orthogonal polarisation states) of the projection objective are calculated.

Figure 3:
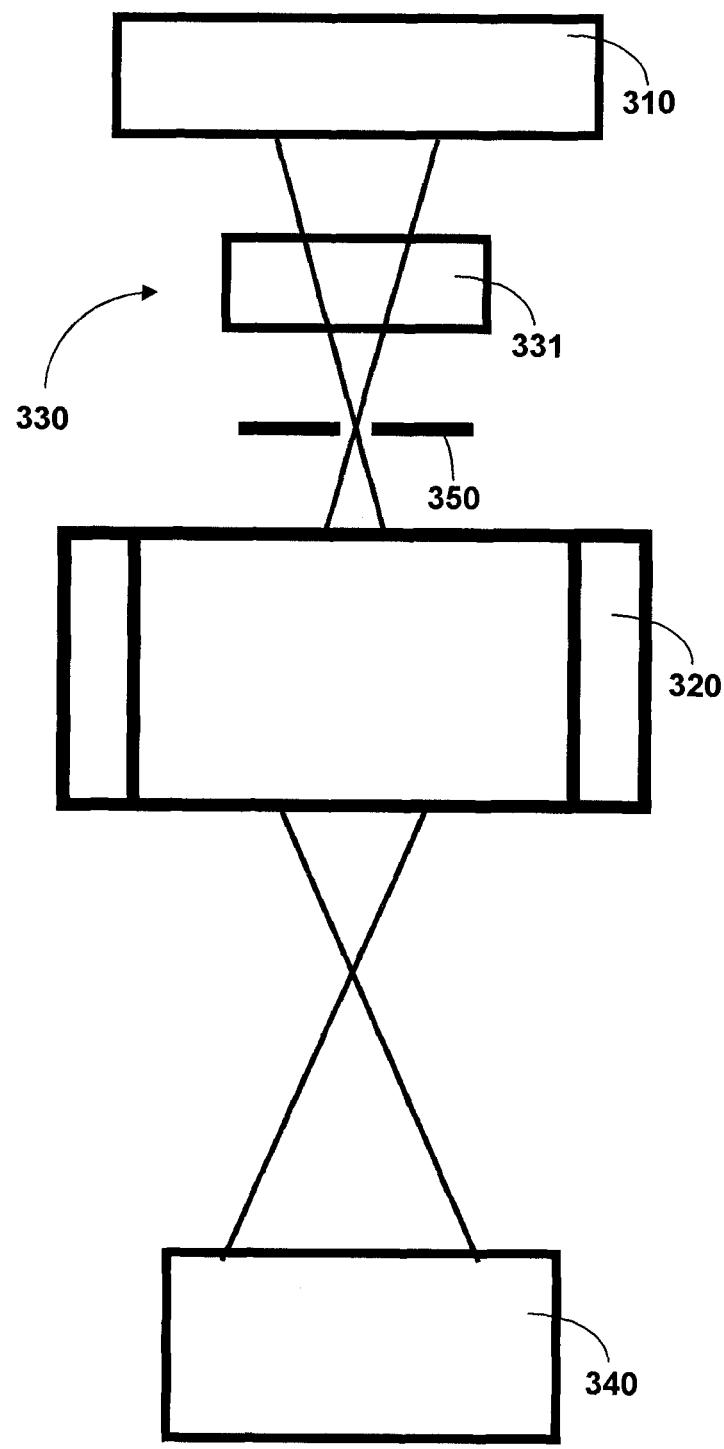

FIG. 3 shows a further simplified measurement structure, wherein once again components which are similar to FIG. 2 or which involve essentially the same function are identified by references increased by '100'.

The measurement structure in FIG. 3 differs from that in FIG. 2 in that a rotatable polariser 331 is provided only within the polarisation state generator 330, and therefore the polariser 331 in the polarisation state generator 330 represents the sole polarisation-optical element of the measurement structure in FIG. 3. In contrast the polarisation state detector 340 includes only a measurement head with CCD camera which makes it possible to record the distribution of intensity in the exit pupil and measurement of the exit wave front (for example by interferometric means).

In operation of the arrangement shown in FIG. 3 the polariser 331 is rotated about the optical axis or light propagation direction of the projection objective 320. In that case, in dependence on the rotary position of the polariser 331 (that is to say in dependence on the direction of the linear entrance polarisation) the resulting variation in the intensity in the exit pupil and the wave front is ascertained. The retardation and also diattenuation (in each case both in respect of magnitude and also axis directions) can be ascertained in per se known manner from the amplitude and the phase of that variation in intensity.

Figure 4A:
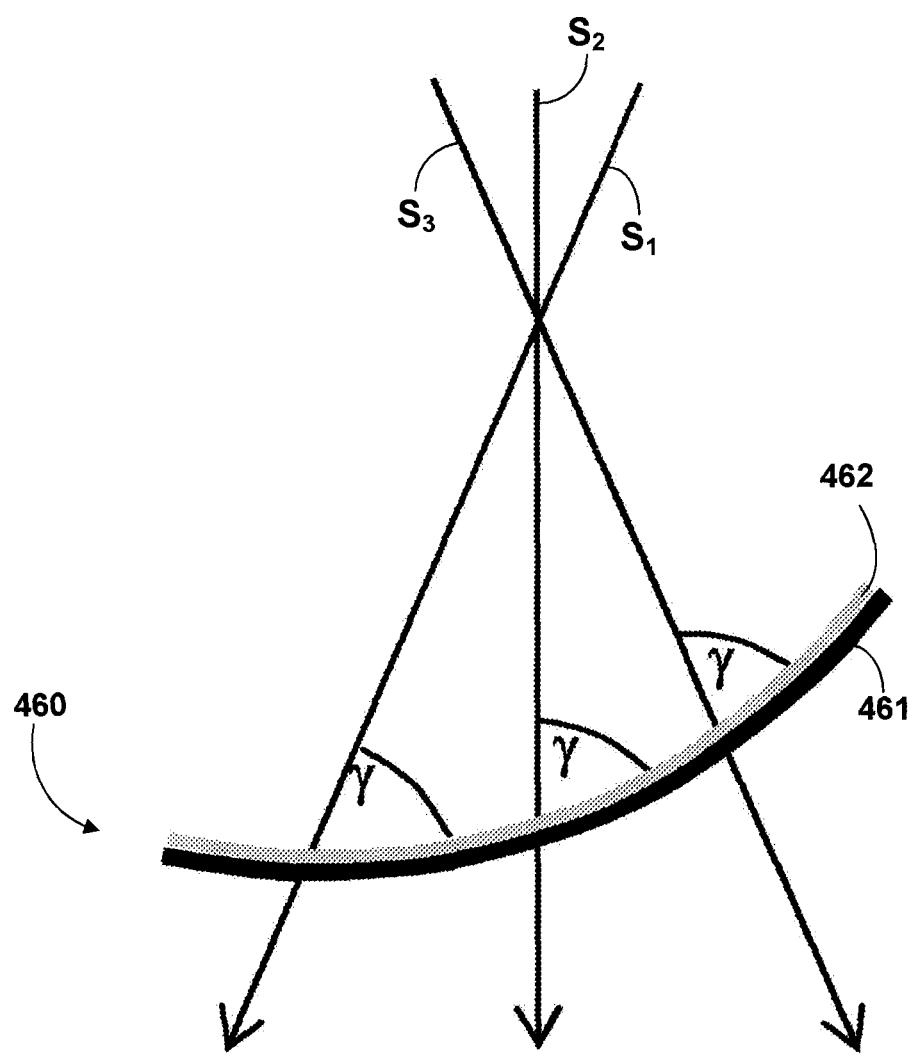
Figure 4B:
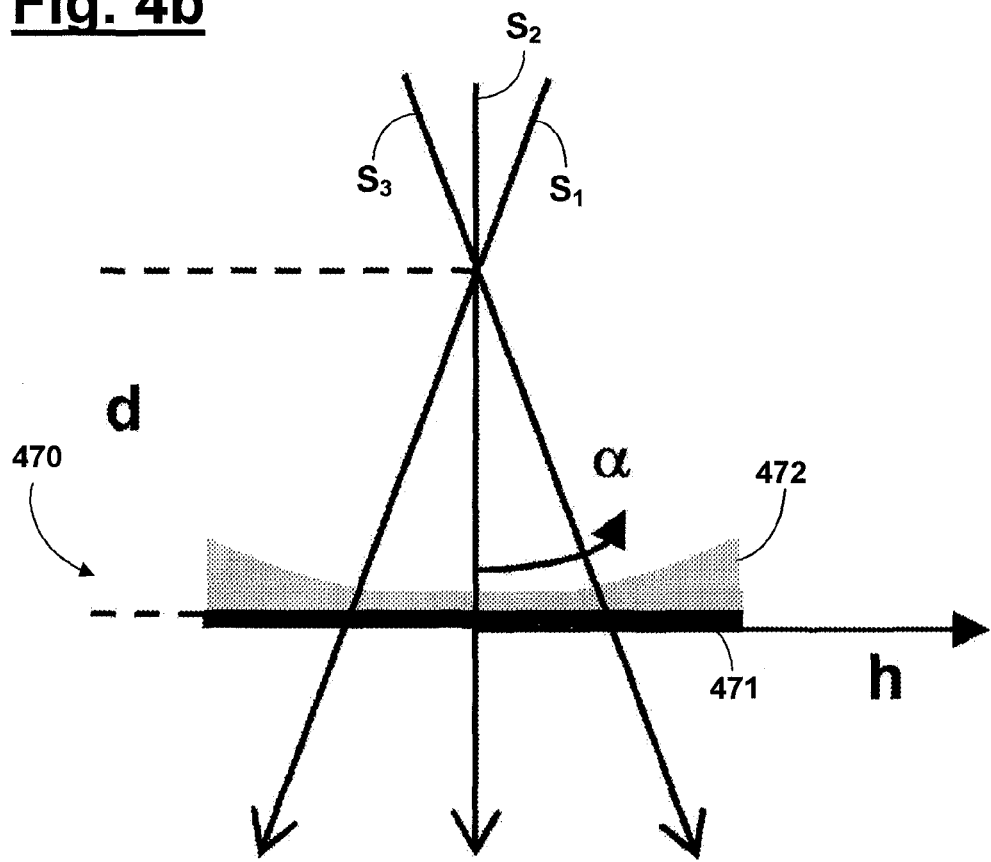

Reference will now be made to FIGS. 4a and 4b to describe embodiments by way of example of multi-layer systems used in the arrangements shown in FIGS. 1-3 for embodying the polarisation-optical components used there.

In these embodiments the multi-layer system used in the polarisation-optical elements (polariser and/or retarder) used according to the invention is respectively so designed that account is taken of the fact that, in contrast to a projection exposure apparatus operated at wavelengths in the DUV range (for example of about 193 nm or about 248 nm), in the present case, that is to say in the EUV range, no refractive optical elements suitable for affording a structural space that is still acceptable are available for producing a beam path parallel to the optical axis.

In accordance with the invention both at the entrance side and also at the exit side, in relation to the projection objective 320, that problem is resolved in that, in spite of the divergent beam path shown in each of FIGS. 4a-b, homogeneity of the polarisation-optical effect produced by the multi-layer system is achieved in the angle spectrum both in the entrance pupil and also in the exit pupil.

What is common to the embodiments shown in FIGS. 4a-b is that in each case a multi-layer system 460 and 470 respectively is so designed that it has a light entrance surface which is at least region-wise curved.

As shown in FIG. 4a that curved light entrance surface is embodied in that the application of a plurality of individual layers, identified by reference 462, to a curved substrate 461, is effected in such a way that each of the beam portions $S_1$, $S_2$ and $S_3$ is incident on the multi-layer system 460, having regard to the aperture of the system, at almost the same angle of incidence γ.

Multiple reflection of the incident radiation occurs in the multi-layer system, wherein the proportion which is finally transmitted through the multi-layer system and which accordingly is to be as large as possible is considered. For that purpose the substrate 461 is preferably of a relatively small thickness of for example not more than 400 nm.

Suitable substrate materials are for example silicon (S), silicon nitride ($Si_3N_4$) or silicon carbide (SiC). The multi-layer system 460 and 470 respectively alternately comprises comparatively high-refractive and low-refractive layers (for example a succession of molybdenum (Mo) and silicon (Si)).

FIG. 4b shows an alternative configuration of a multi-layer system 470, in which case the plurality of individual layers, identified by reference 472, for producing the multi-layer system 470, is provided on a flat substrate 471 with a varying layer thickness (shown on an exaggerated scale in FIG. 4b). The multi-layer system 470 is made up of optically anisotropic layer materials, in which respect advantage is taken of the fact that, as a consequence of the anisotropy and the variable layer thickness, once again all beam portions $S_1$, $S_2$ and $S_3$ experience the same polarisation action or the same retardation having regard to the aperture of the system.

Figure 4C:
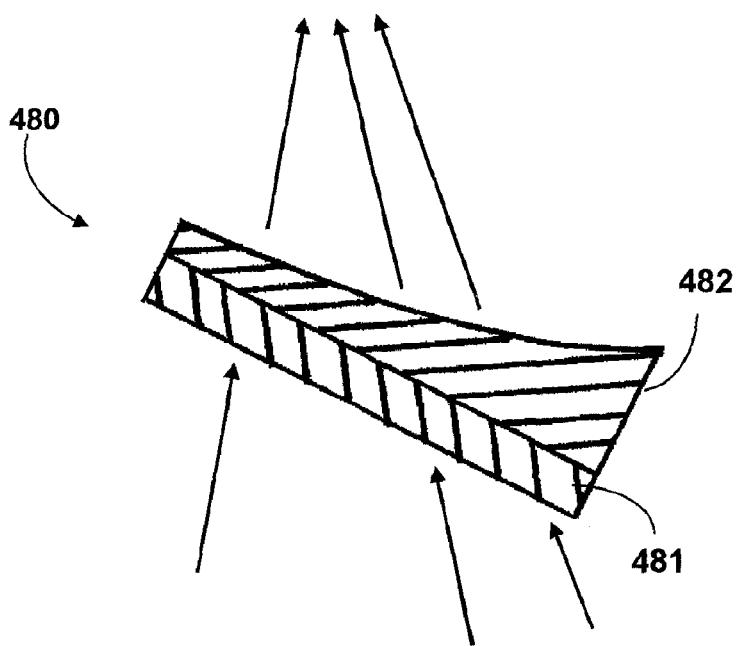

FIG. 4c shows a multi-layer system 480 which is similar to the embodiment of FIG. 4b with a varying thickness profile, having a plurality of individual layers identified by reference 482, being arranged in tilted relationship with the beam path or the optical axis of the system on a flat substrate 481 to achieve the desired homogeneity of the polarisation-influencing action in the angle spectrum, having regard to the aperture of the system.

Figure 5A:
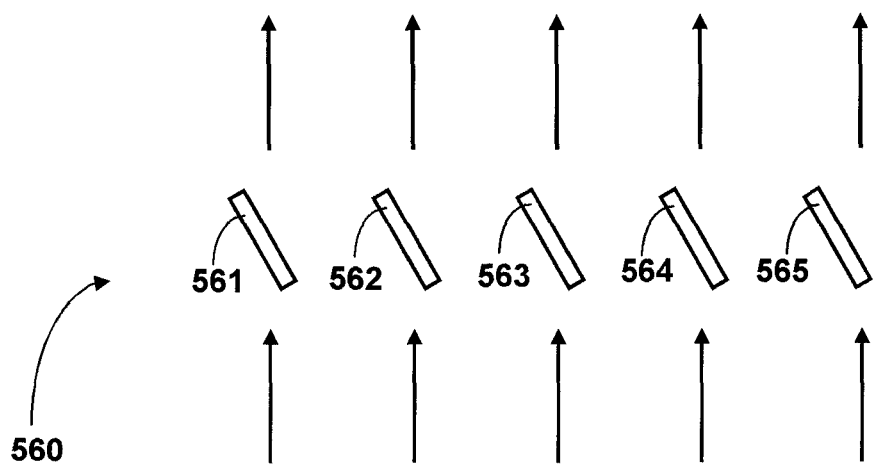
Figure 5B:
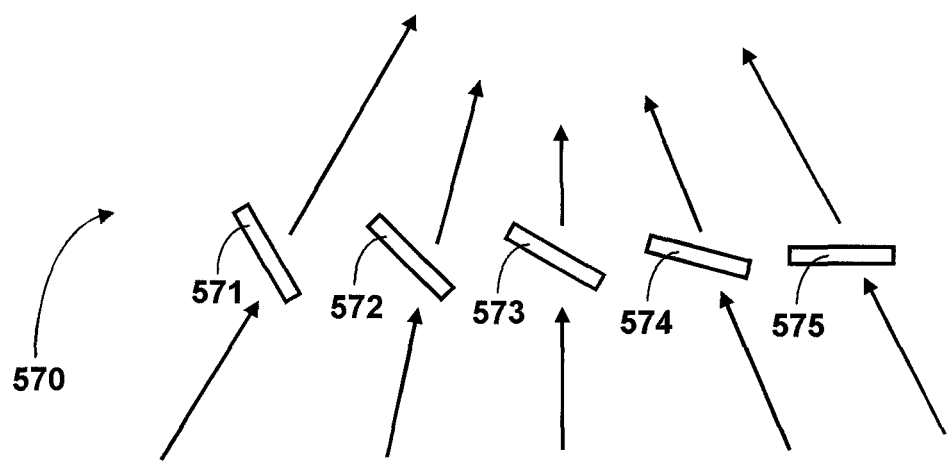

FIGS. 5a and 5b show further embodiments for embodying the above-described polarisation-optical elements. In these embodiments it is assumed that the respectively desired polarisation-optical action cannot be achieved over a sufficiently large range of angles of incidence, even with the curved light entrance surfaces, in accordance with the configurations shown in FIGS. 4a-c.

For that case it is advantageous, as shown in FIG. 5a, to provide a plurality of substrates which in the example are in the form of plane-parallel plates and of which only five substrates 561 through 565 are shown by way of example in FIG.

5a, with a respective multi-layer system, and to arrange same in suitably tilted relationship at different positions in the beam path. The substrates 561 through 565 also preferably involve a relatively small thickness of for example a maximum of 400 nm, preferably a maximum of 100 nm and further preferably a maximum of 50 nm.

While the arrangement 560 shown in FIG. 5a comprising the plurality of substrates 561 through 565 for use in a parallel-beam geometry has the same respective angle for the individual substrates 561 through 565 relative to the light propagation direction, in accordance with the non-parallel-beam geometry shown in FIG. 5b the individual substrates 571 through 575 of the arrangement 570 are tilted at different angles to the optical axis. Accordingly, in both embodiments in FIGS. 5a and 5b, the desired homogeneity of the polarisation-influencing action in the angle spectrum is again achieved, having regard to the aperture of the system.

Figure 6:
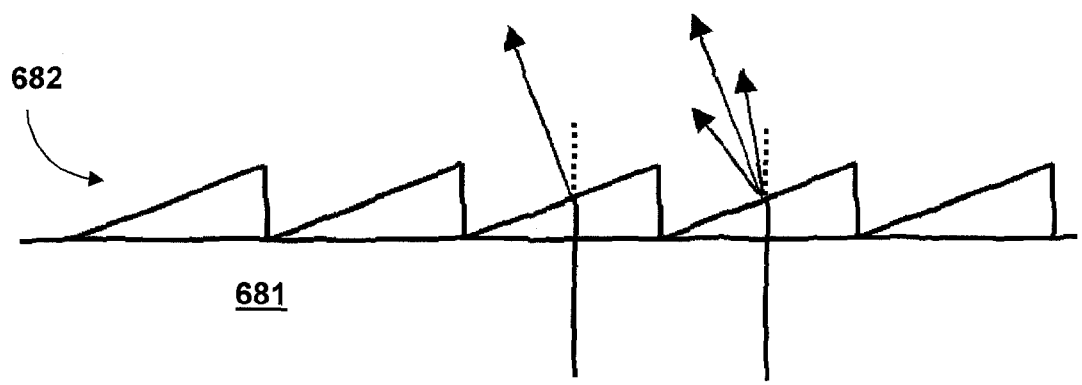

In a further embodiment diagrammatically shown in FIG. 6, to implement a wavelength filter, a wedge-shaped coating 682 with a material with a refractive index different from one (for example molybdenum (Mo) or ruthenium (Ru)) is also applied to a substrate 681, for example using displaceable orifice plate members, so that the effect ultimately achieved corresponds to that of a plurality of individual prisms and is 'tunable' by way of the tilt. In that case advantage is taken of the wavelength dependency of the deflection angles in prisms by virtue of the dispersion of the refractive index.

Reference is now made to FIGS. 7-11 and Tables 1-4 to describe embodiments by way of example of multi-layer systems suitable for use in polarisation-optical components used according to the invention.

Table 1 firstly shows a design of a multi-layer system suitable for embodying a polariser, for example in the polarisation state generator 130, 230 or 330 or in the polarisation state detector 140, 240 or 340. The layer design of Table 1 uses exclusively molybdenum (Mo) and silicon (Si) as layer materials. That layer design is optimised in the transmission mode for an angle of 43° in the proximity of the pseudo-Brewster angle (near 45°). In regard to the layer design advantage is taken of the fact that s-polarised light exhibits markedly greater Fresnel reflection at the Mo—Si interfaces than p-polarised light. The layer design is comparable to that of a mirror designed for the corresponding angle of incidence, typical individual layer thicknesses being in the region of a quarter of the working wavelength. In general terms, in the configuration of the layer design both for the polariser and also for the wavelength filter, attention is to be paid to the fact that the total thickness does not become too great as otherwise the transmitted proportion of light becomes excessively small.

Figure 7A:
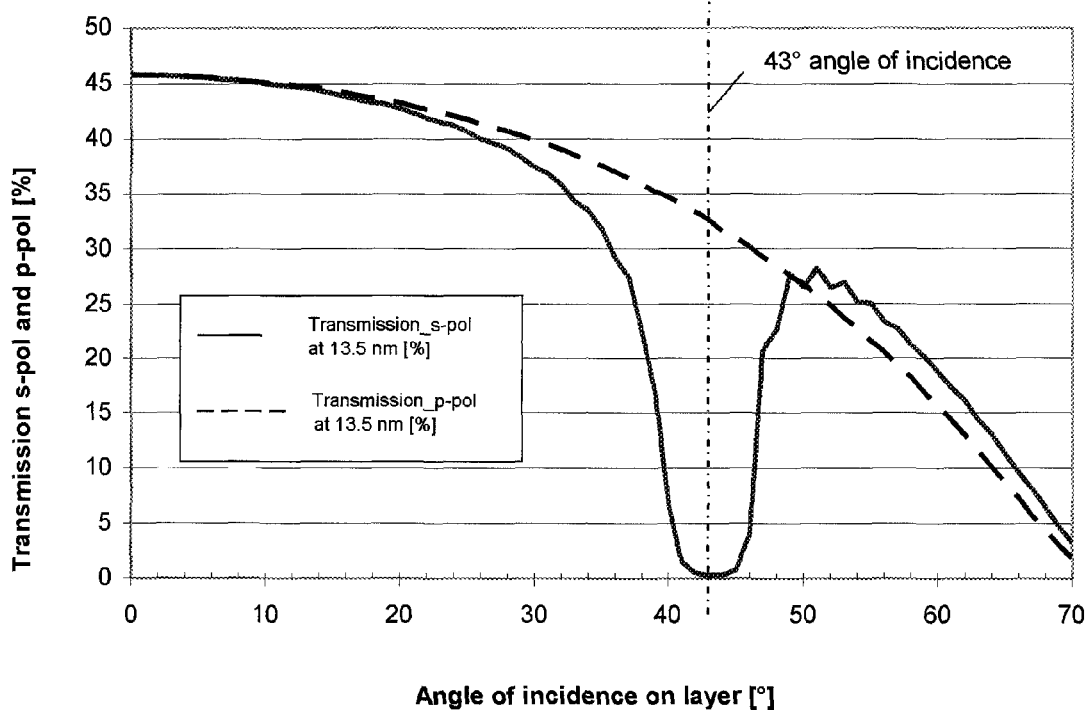
FIGS. 7-11 show diagrams for characterising various embodiments of multi-layer systems used according to the invention.

As can be seen from the transmission characteristics shown in FIG. 7a in dependence on the angle of incidence for s- and p-polarised light respectively, s-polarised light is greatly reflected in the relevant angle range around about 43° while predominantly p-polarised light is transmitted.

Figure 8A:
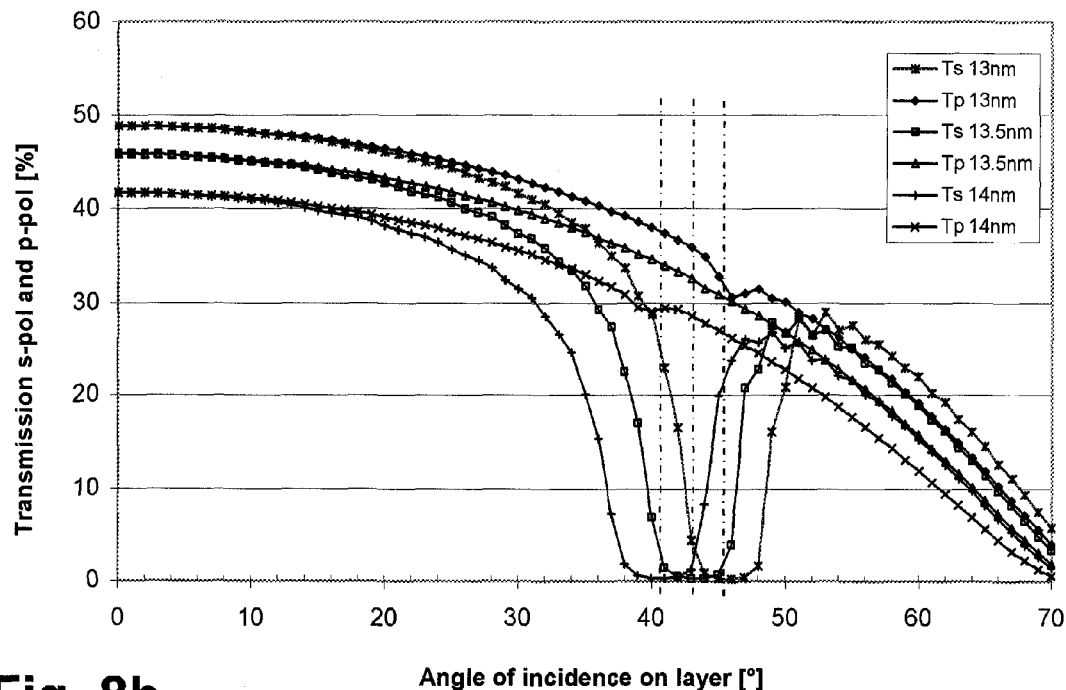
Figure 8B:
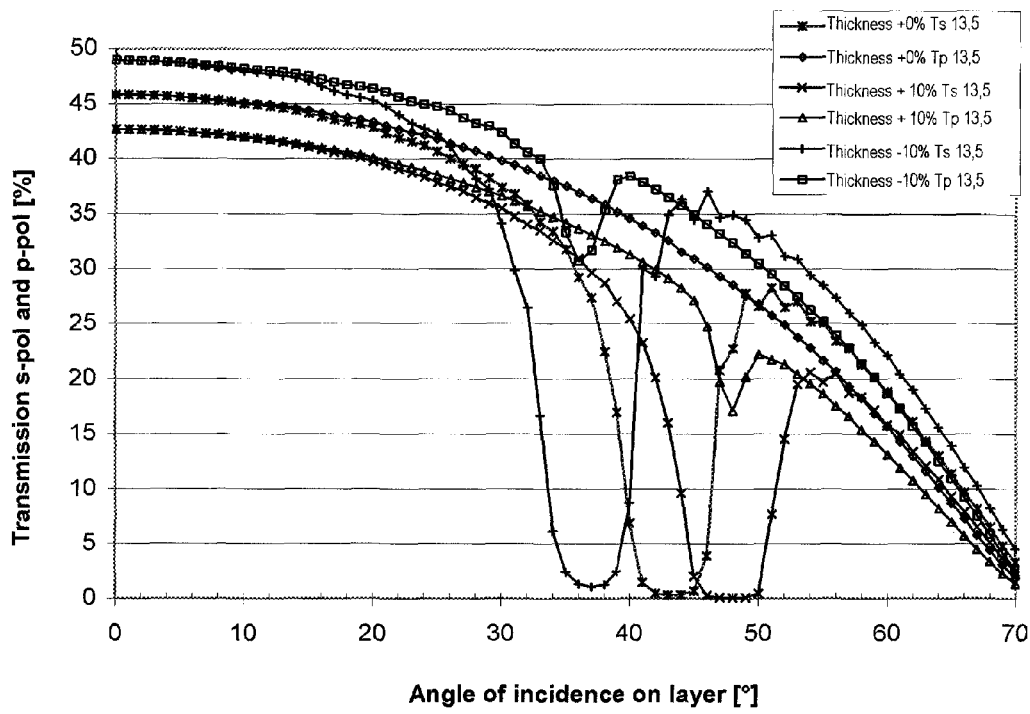

FIG. 8 shows, for the Table 1 layer design, the dependency of transmission for s- or p-polarised light respectively on the angle of incidence for different wavelengths (FIG. 8a) and for different layer thicknesses (FIG. 8b). It will be seen from FIG. 8a that the multi-layer system is in each case only suitable in a restricted wavelength and angle range with the desired action so that, in the case of a variation in the wavelength, over a greater range, the multi-layer system is to be arranged in correspondingly tilted relationship. FIG. 8b further shows that the angle of incidence at which the multi-layer system exhibits the desired action can be varied by altering the total layer thickness (wherein all individual thicknesses are altered by the same factor).

Figure 7B:
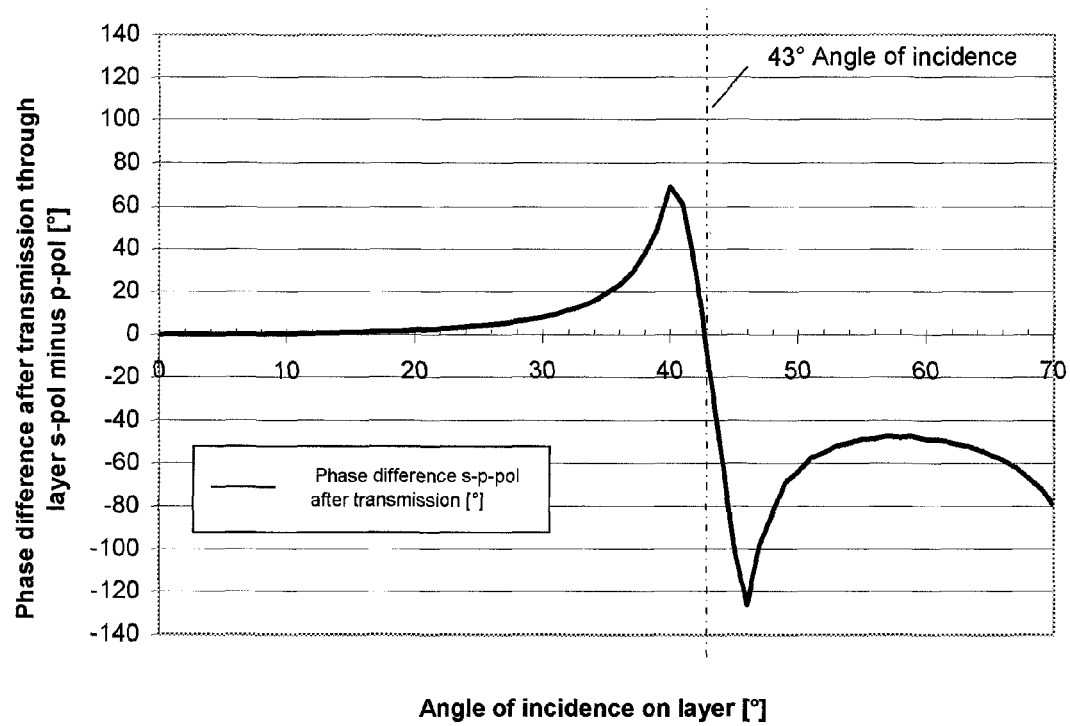
Figure 9A:
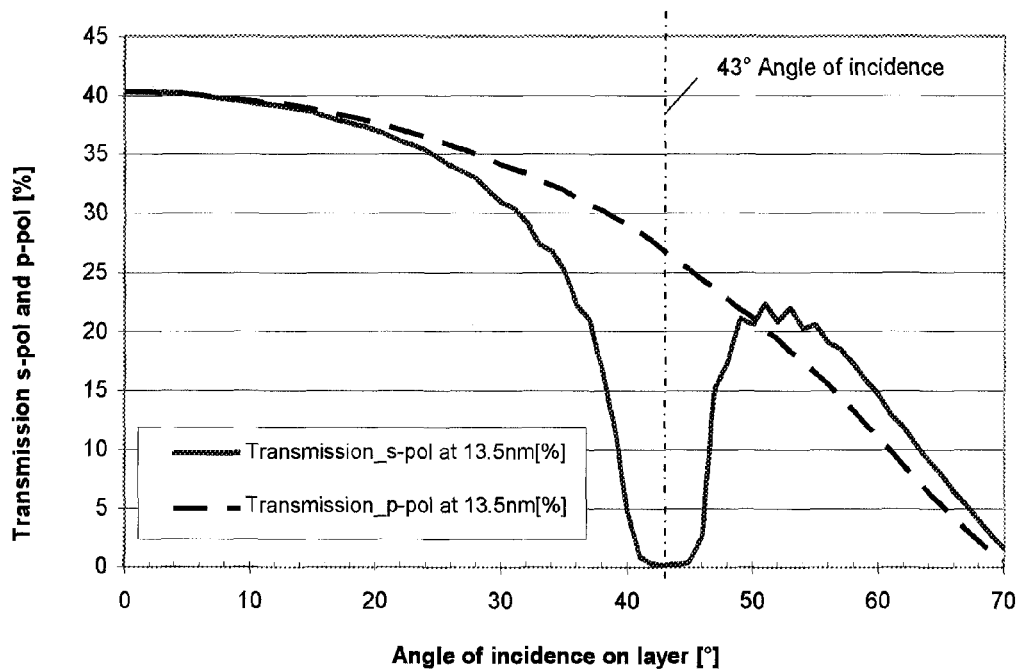
Figure 9B:
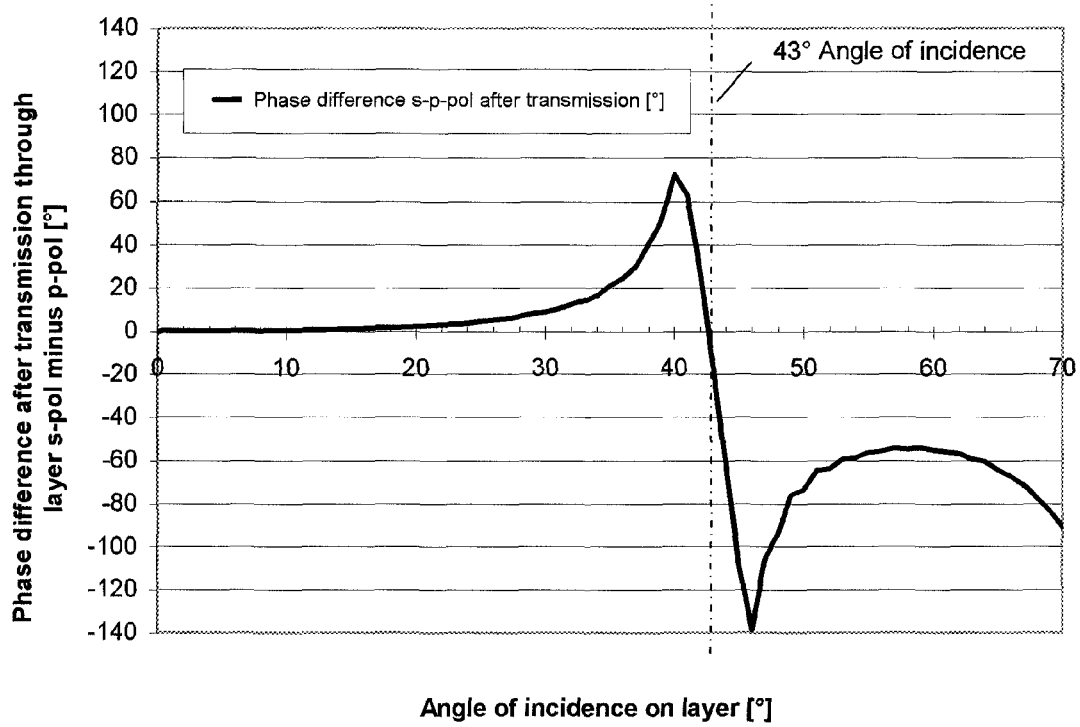

Table 2 and FIGS. 9a-9b show views similar to the embodiment of Table 1 and FIGS. 7a-7b of a further embodiment of a multi-layer system in which, in addition to molybdenum (Mo) and silicon (Si), ruthenium (Ru) is also used as a further layer material. The use of ruthenium (Ru) as a further layer material is in this case only by way of example and it is also possible to employ other suitable materials with different or deviating refractive index n as well as comparatively slight attenuation such as for example silicon (Si), potassium (K), silicon carbide (SiC), yttrium (Y), zirconium (Zr), boron carbide ($B_4C$), boron (B), carbon (C), silicon nitride ($Si_3N_4$), boron nitride (BN), niobium (Nb), molybdenum carbide (MoC), molybdenum (Mo) or rhodium (Rh).

Figure 10A:
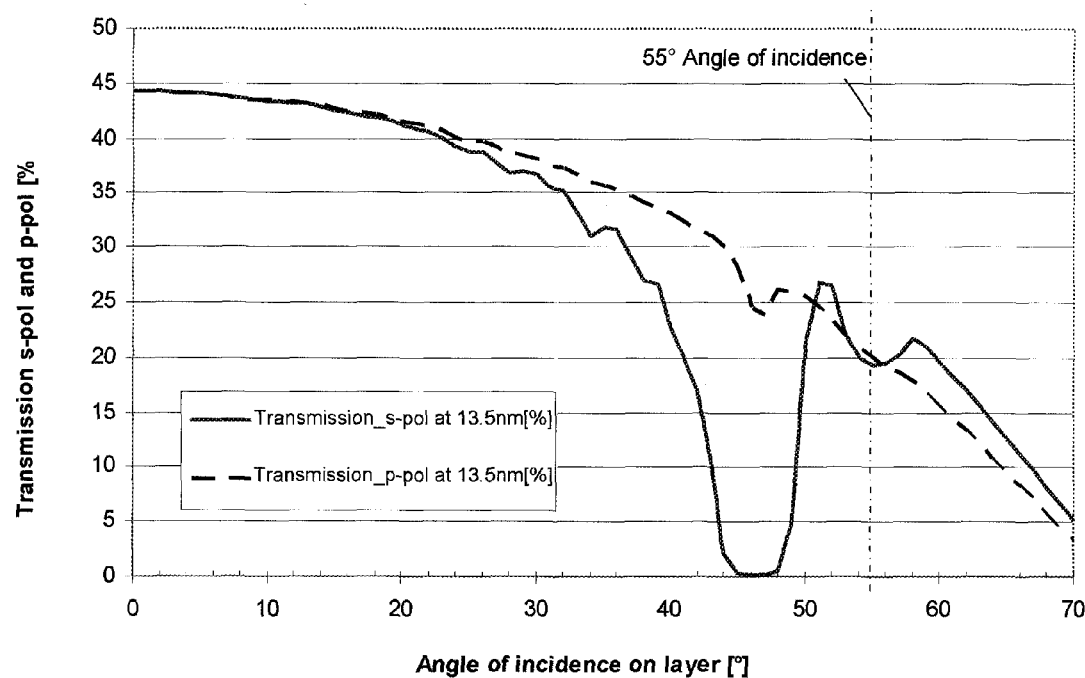
Figure 10B:
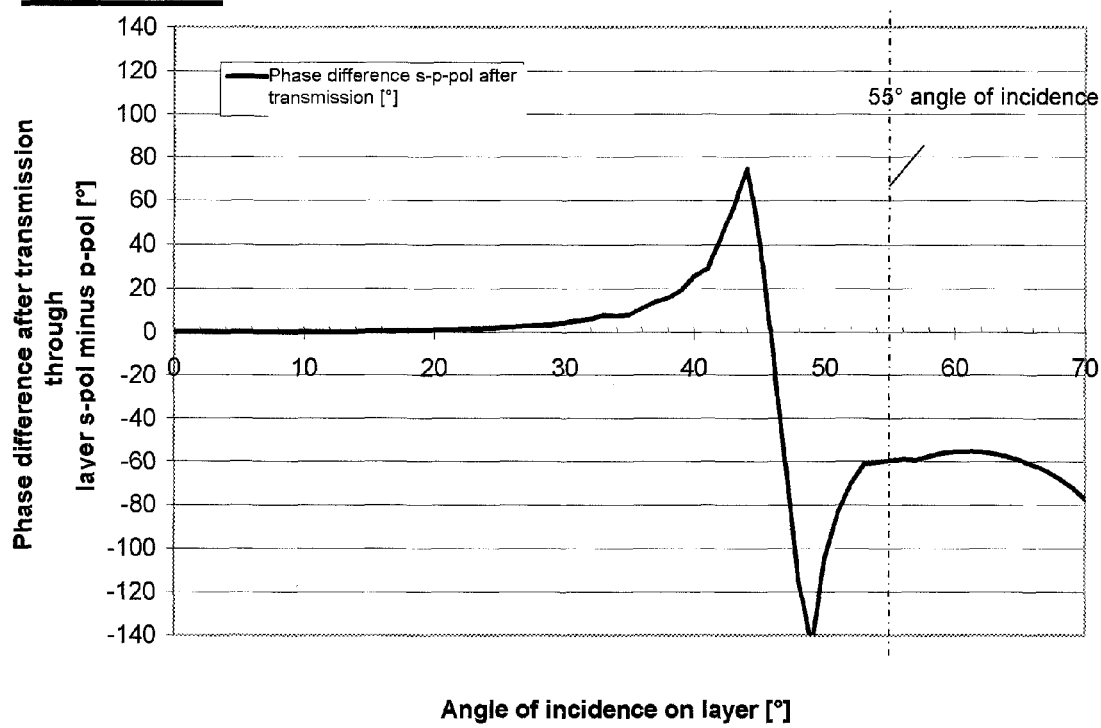

Table 3 and FIGS. 10a-b describe an embodiment for a retarder layer, for example for use in the polarisation state generator 130, 230 or 330 or the polarisation state detector 140, 240 or 340. The layer system is optimised for an angle of incidence of about 55°, wherein—insofar as similar to the embodiment in Table 1—once again exclusively molybdenum (Mo) and silicon (Si) are used as layer materials and the individual layer thicknesses are again in the region of a quarter of the working wavelength.

Figure 11:
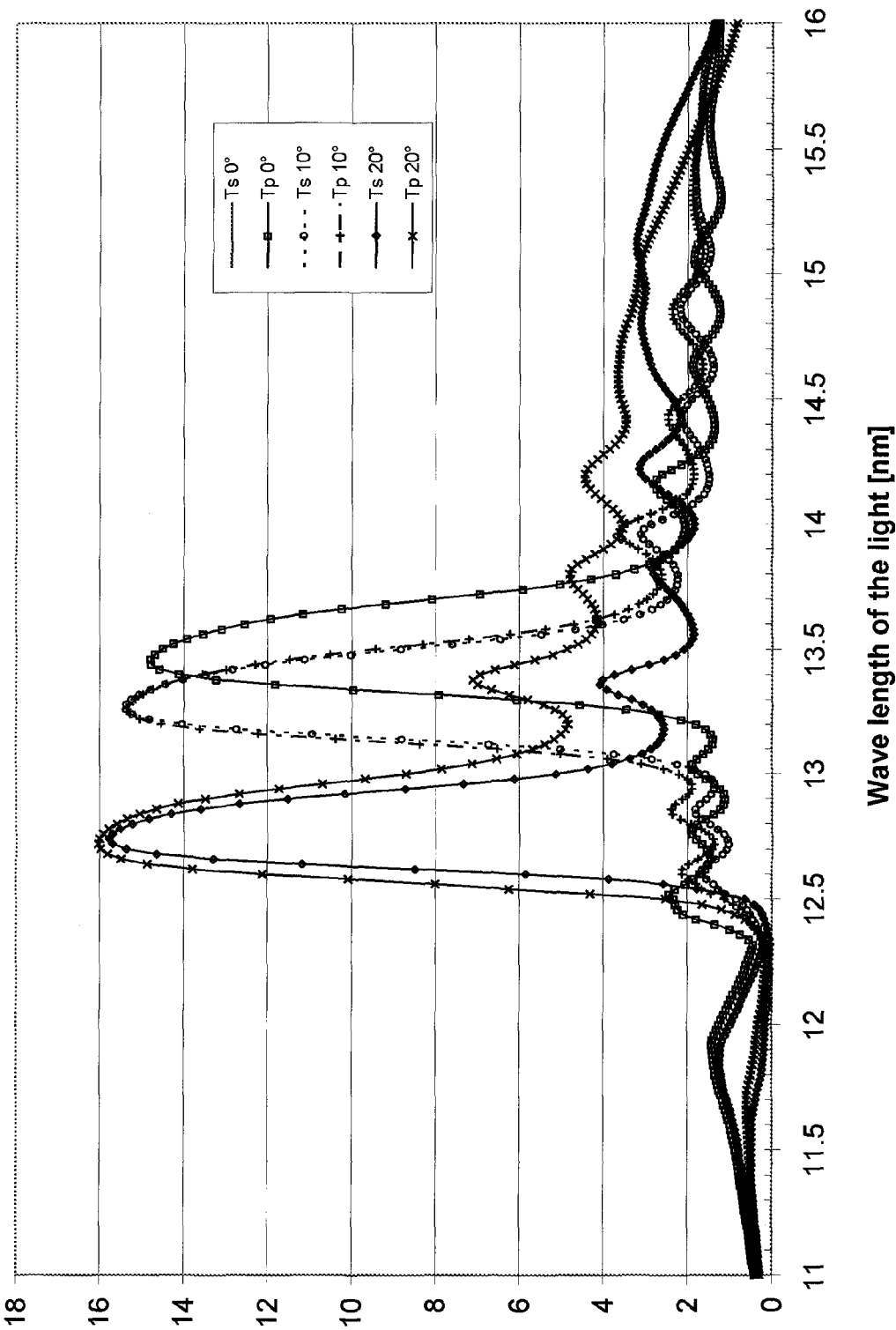

Table 4 and FIG. 11 shows an embodiment for a layer design which is suitable for embodying a wavelength filter or a 'monochromator layer' in the above-described measurement arrangements. Although in this embodiment molybdenum (Mo), silicon (Si) and ruthenium (Ru) are used as layer materials, that is not absolutely necessary, but similarly to the above-described embodiments it is also possible to implement a layer design using only two different layer materials (for example molybdenum and silicon).

The property of the layer system of Table 4 whereby only a given wavelength of the incident light is transmitted is 'tunable' as shown in FIG. 11 by way of the angle of incidence (specified in the legend), that is to say the wavelength to be transmitted can be predetermined or selected by way of the tilt angle of the substrate. In particular operation is also possible with almost perpendicular light incidence.

Even if the invention has been described by reference to specific embodiments numerous variations and alternative embodiments will be apparent to the man skilled in the art, for example by combination and/or exchange of features of individual embodiments. Accordingly it will be appreciated by the man skilled in the art that such variations and alternative embodiments are also embraced by the present invention and the scope of the invention is limited only in the sense of the accompanying claims and equivalents thereof.

The above description of the embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

TABLE 1

Layer design for FIGS. 7-8

| Layer No. | Thickness[nm] | Material |
|---|---|---|
|  |  | Substrate |
| 1 | 4.854 | Mo |
| 2 | 5.17 | Si |
| 3 | 4.912 | Mo |
| 4 | 5.185 | Si |
| 5 | 4.795 | Mo |

TABLE 1-continued

Layer design for FIGS. 7-8

| Layer No. | Thickness[nm] | Material |
|---|---|---|
| 6 | 5.196 | Si |
| 7 | 4.776 | Mo |
| 8 | 5.203 | Si |
| 9 | 4.763 | Mo |
| 10 | 5.208 | Si |
| 11 | 4.753 | Mo |
| 12 | 5.212 | Si |
| 13 | 4.747 | Mo |
| 14 | 5.214 | Si |
| 15 | 4.743 | Mo |
| 16 | 5.216 | Si |
| 17 | 4.74 | Mo |
| 18 | 5.217 | Si |
| 19 | 4.738 | Mo |
| 20 | 5.217 | Si |
| 21 | 4.738 | Mo |
| 22 | 5.217 | Si |
| 23 | 4.738 | Mo |
| 24 | 5.217 | Si |
| 25 | 4.74 | Mo |
| 26 | 5.216 | Si |
| 27 | 4.743 | Mo |
| 28 | 5.214 | Si |
| 29 | 4.747 | Mo |
| 30 | 5.212 | Si |
| 31 | 4.753 | Mo |
| 32 | 5.208 | Si |
| 33 | 4.762 | Mo |
| 34 | 5.203 | Si |
| 35 | 4.776 | Mo |
| 36 | 5.196 | Si |
| 37 | 4.795 | Mo |
| 38 | 5.185 | Si |
| 39 | 4.912 | Mo |
| 40 | 5.17 | Si |
| 41 | 4.991 | Mo |
|  |  | Incidence medium |

TABLE 2

Layer design for FIG. 9

| Layer No. | Thickness[nm] | Material |
|---|---|---|
|  |  | Substrate |
| 1 | 0.97 | Mo |
| 2 | 2.24 | Ru |
| 3 | 1.773 | Mo |
| 4 | 5.125 | Si |
| 5 | 1.428 | Mo |
| 6 | 1.792 | Ru |
| 7 | 1.823 | Mo |
| 8 | 5.14 | Si |
| 9 | 1.609 | Mo |
| 10 | 1.5 | Ru |
| 11 | 1.869 | Mo |
| 12 | 5.15 | Si |
| 13 | 4.828 | Mo |
| 14 | 5.157 | Si |
| 15 | 4.816 | Mo |
| 16 | 5.162 | Si |
| 17 | 4.808 | Mo |
| 18 | 5.165 | Si |
| 19 | 4.802 | Mo |
| 20 | 5.168 | Si |
| 21 | 4.798 | Mo |
| 22 | 5.169 | Si |
| 23 | 4.795 | Mo |
| 24 | 5.17 | Si |
| 25 | 4.794 | Mo |
| 26 | 5.171 | Si |
| 27 | 4.793 | Mo |
| 28 | 5.171 | Si |

TABLE 2-continued

Layer design for FIG. 9

| Layer No. | Thickness[nm] | Material |
|---|---|---|
| 29 | 4.794 | Mo |
| 30 | 5.17 | Si |
| 31 | 4.795 | Mo |
| 32 | 5.169 | Si |
| 33 | 4.798 | Mo |
| 34 | 5.168 | Si |
| 35 | 4.802 | Mo |
| 36 | 5.165 | Si |
| 37 | 4.808 | Mo |
| 38 | 5.162 | Si |
| 39 | 4.816 | Mo |
| 40 | 5.157 | Si |
| 41 | 4.828 | Mo |
| 42 | 5.15 | Si |
| 43 | 1.869 | Mo |
| 44 | 1.498 | Ru |
| 45 | 1.61 | Mo |
| 46 | 5.14 | Si |
| 47 | 1.823 | Mo |
| 48 | 1.79 | Ru |
| 49 | 1.43 | Mo |
| 50 | 5.125 | Si |
| 51 | 1.773 | Mo |
| 52 | 2.238 | Ru |
| 53 | 1.11 | Mo |
|  |  | Incidence medium |

TABLE 3

Layer design for FIG. 10

| Layer No. | Thickness[nm] | Material |
|---|---|---|
|  |  | Substrate |
| 1 | 1.661 | Mo |
| 2 | 6.127 | Si |
| 3 | 3.633 | Mo |
| 4 | 6.444 | Si |
| 5 | 3.775 | Mo |
| 6 | 6.456 | Si |
| 7 | 3.839 | Mo |
| 8 | 6.571 | Si |
| 9 | 3.971 | Mo |
| 10 | 6.662 | Si |
| 11 | 3.956 | Mo |
| 12 | 6.562 | Si |
| 13 | 3.771 | Mo |
| 14 | 6.384 | Si |
| 15 | 3.719 | Mo |
| 16 | 6.447 | Si |
| 17 | 3.919 | Mo |
| 18 | 6.619 | Si |
| 19 | 4.028 | Mo |
| 20 | 6.619 | Si |
| 21 | 3.928 | Mo |
| 22 | 6.504 | Si |
| 23 | 3.852 | Mo |
| 24 | 6.54 | Si |
| 25 | 3.957 | Mo |
| 26 | 6.674 | Si |
| 27 | 3.973 | Mo |
| 28 | 6.601 | Si |
| 29 | 3.689 | Mo |
| 30 | 6.279 | Si |
| 31 | 3.501 | Mo |
| 32 | 6.358 | Si |
| 33 | 3.931 | Mo |
| 34 | 6.789 | Si |
| 35 | 4.334 | Mo |
| 36 | 6.982 | Si |
| 37 | 4.341 | Mo |
| 38 | 6.84 | Si |
| 39 | 3.843 | Mo |

TABLE 3-continued

Layer design for FIG. 10

| Layer No. | Thickness[nm] | Material |
|---|---|---|
| 40 | 6.256 | Si |
| 41 | 3.144 | Mo |
| 42 | 6.076 | Si |
| 43 | 3.583 | Mo |
| 44 | 6.716 | Si |
| 45 | 4.197 | Mo |
| 46 | 6.932 | Si |
| 47 | 4.183 | Mo |
| 48 | 6.671 | Si |
| 49 | 2.614 | Mo |
|  |  | Incidence medium |

TABLE 4

Layer design for FIG. 11

| Layer No. | Thickness[nm] | Material |
|---|---|---|
|  |  | Substrate |
| 1 | 2.593 | Mo |
| 2 | 4.264 | Si |
| 3 | 3.19 | Mo |
| 4 | 4.265 | Si |
| 5 | 3.259 | Mo |
| 6 | 4.447 | Si |
| 7 | 3.219 | Mo |
| 8 | 4.726 | Si |
| 9 | 3.147 | Mo |
| 10 | 4.785 | Si |
| 11 | 3.142 | Mo |
| 12 | 4.604 | Si |
| 13 | 3.159 | Mo |
| 14 | 4.448 | Si |
| 15 | 3.067 | Mo |
| 16 | 4.345 | Si |
| 17 | 2.694 | Mo |
| 18 | 4.154 | Si |
| 19 | 2.33 | Mo |
| 20 | 4.132 | Si |
| 21 | 2.861 | Mo |
| 22 | 4.225 | Si |
| 23 | 3.219 | Mo |
| 24 | 4.268 | Si |
| 25 | 3.305 | Mo |
| 26 | 4.415 | Si |
| 27 | 3.258 | Mo |
| 28 | 4.919 | Si |
| 29 | 3.217 | Mo |
| 30 | 5.408 | Si |
| 31 | 1.693 | Mo |
| 32 | 1.817 | Ru |
| 33 | 4.58 | Si |
| 34 | 0.52 | Mo |
| 35 | 2.414 | Ru |
| 36 | 0.628 | Mo |
| 37 | 4.531 | Si |
| 38 | 1.706 | Ru |
| 39 | 1.799 | Mo |
| 40 | 4.99 | Si |
| 41 | 3.193 | Mo |
| 42 | 4.734 | Si |
| 43 | 3.079 | Mo |
| 44 | 4.41 | Si |
| 45 | 2.999 | Mo |
| 46 | 4.367 | Si |
| 47 | 2.864 | Mo |
| 48 | 4.622 | Si |
| 49 | 2.707 | Mo |
| 50 | 5.103 | Si |
| 51 | 2.771 | Mo |
| 52 | 4.781 | Si |
| 53 | 3.018 | Mo |
| 54 | 4.254 | Si |
| 55 | 3.075 | Mo |
| 56 | 4.033 | Si |
| 57 | 2.896 | Mo |
| 58 | 3.895 | Si |
| 59 | 2.528 | Mo |
| 60 | 3.841 | Si |
| 61 | 2.632 | Mo |
| 62 | 4.04 | Si |
| 63 | 0.149 | Mo |
| 64 | 0.636 | Ru |
| 65 | 2.142 | Mo |
| 66 | 4.284 | Si |
| 67 | 0.512 | Ru |
| 68 | 2.447 | Mo |
| 69 | 4.953 | Si |
| 70 | 2.614 | Mo |
| 71 | 5.335 | Si |
| 72 | 2.528 | Mo |
| 73 | 4.788 | Si |
| 74 | 2.59 | Mo |
| 75 | 4.56 | Si |
| 76 | 2.457 | Mo |
| 77 | 4.844 | Si |
| 78 | 1.796 | Mo |
| 79 | 14.561 | Si |
| 80 | 0.891 | Mo |
| 81 | 1.661 | Ru |
| 82 | 4.301 | Si |
| 83 | 0.698 | Mo |
| 84 | 1.953 | Ru |
| 85 | 0.229 | Mo |
| 86 | 4.004 | Si |
| 87 | 0.55 | Mo |
| 88 | 1.961 | Ru |
| 89 | 0.369 | Mo |
| 90 | 3.845 | Si |
| 91 | 0.5 | Mo |
| 92 | 1.957 | Ru |
| 93 | 0.395 | Mo |
| 94 | 3.777 | Si |
| 95 | 0.492 | Mo |
| 96 | 2.049 | Ru |
| 97 | 0.394 | Mo |
| 98 | 3.763 | Si |
| 99 | 0.451 | Mo |
| 100 | 2.137 | Ru |
| 101 | 0.443 | Mo |
| 102 | 3.903 | Si |
| 103 | 2.356 | Ru |
| 104 | 0.534 | Mo |
| 105 | 3.747 | Si |
| 106 | 0.311 | Mo |
| 107 | 2.06 | Ru |
| 108 | 0.606 | Mo |
| 109 | 3.859 | Si |
| 110 | 2.156 | Ru |
| 111 | 0.616 | Mo |
| 112 | 3.883 | Si |
| 113 | 2.139 | Ru |
| 114 | 0.565 | Mo |
| 115 | 3.776 | Si |
| 116 | 0.342 | Mo |
| 117 | 2.005 | Ru |
| 118 | 0.492 | Mo |
| 119 | 3.959 | Si |
| 120 | 2.262 | Ru |
| 121 | 0.448 | Mo |
| 122 | 3.803 | Si |
| 123 | 0.399 | Mo |
| 124 | 2.09 | Ru |
| 125 | 0.444 | Mo |
| 126 | 3.82 | Si |
| 127 | 0.378 | Mo |
| 128 | 2.097 | Ru |
| 129 | 0.477 | Mo |
| 130 | 3.85 | Si |

TABLE 4-continued

Layer design for FIG. 11

| Layer No. | Thickness[nm] | Material |
|---|---|---|
| 131 | 0.337 | Mo |
| 132 | 2.047 | Ru |
| 133 | 0.516 | Mo |
| 134 | 3.893 | Si |
| 135 | 0.32 | Mo |
| 136 | 1.93 | Ru |
| 137 | 0.487 | Mo |
| 138 | 3.929 | Si |
| 139 | 0.401 | Mo |
| 140 | 1.795 | Ru |
| 141 | 0.317 | Mo |
| 142 | 3.956 | Si |
| 143 | 0.61 | Mo |
| 144 | 1.752 | Ru |
| 145 | 0.117 | Mo |
| 146 | 3.996 | Si |
| 147 | 0.793 | Mo |
| 148 | 1.802 | Ru |
| 149 | 4.004 | Si |
| 150 | 0.922 | Mo |
| 151 | 1.697 | Ru |
| 152 | 3.871 | Si |
| 153 | 1.248 | Mo |
| 154 | 1.288 | Ru |
| 155 | 3.715 | Si |
| 156 | 1.832 | Mo |
| 157 | 0.87 | Ru |
| 158 | 3.822 | Si |
| 159 | 1.972 | Mo |
| 160 | 0.667 | Ru |
| 161 | 0.371 | Mo |
| 162 | 3.889 | Si |
| 163 | 3.08 | Mo |
| 164 | 3.481 | Si |

The invention claimed is:

1. An arrangement for characterising the polarisation properties of an optical system, comprising:
    at least one polarisation state generator which sets a defined polarisation state of radiation incident on the optical system; and
    a polarisation state detector adapted to measure the exit polarisation state of radiation issuing from the optical system;
    wherein the optical system is designed for a working wavelength of less than 15 nm;
    wherein at least one of the polarisation state generator and/or the polarisation state detector is so designed that its polarisation-optical action on an incident light beam is substantially constant over an angle spectrum of the light beam of at least 10°, wherein the angle spectrum comprises a spectrum of angles between diverging beam portions of the incident beam;
    wherein the at least one of the polarisation state generator and/or the polarisation state detector has at least one of a rotatable polariser and/or a rotatable retarder;
    wherein the at least one of the rotatable polariser and/or the rotatable retarder has at least one multi-layer system having a plurality of individual layers; and
    wherein the multi-layer system has a light entrance surface which is curved at least in regions along the surface such that an angle of incidence of the light beam on the surface is substantially constant for the angle spectrum of the light beam of at least 10°.

2. The arrangement as claimed in claim 1, wherein the at least one of the polarisation state generator and/or the polarisation state detector is so designed that its polarisation-optical action on an incident light beam is substantially constant over substantially 100% of an entire angle spectrum of the light beam.

3. The arrangement as claimed in claim 1, wherein the at least one of the polarisation state generator and/or the polarisation state detector has at least one optical element operated in transmission mode.

4. The arrangement as claimed in claim 1, wherein the polarisation state detector is adapted for pupil-resolved measurement of the exit polarisation state.

5. The arrangement as claimed in claim 1, wherein the plurality of individual layers is applied to a substrate which is curved at least in regions along the surface.

6. The arrangement as claimed in claim 1, wherein the plurality of individual layers is arranged either free-standing or substrate-less or is arranged on a substrate of a thickness of a maximum of 400 nm.

7. The arrangement as claimed in claim 1, wherein the rotatable polariser produces a linear exit polarisation degree of radiation issuing from the rotatable polariser of at least 95%.

8. The arrangement as claimed in claim 1, wherein the rotatable retarder produces a retardation for radiation passing through the rotatable retarder of lambda/4+40%, wherein lambda is the working wavelength of the optical system.

9. The arrangement as claimed in claim 1, further comprising a light source adapted to output a spectrum of wavelengths of light including the light beam and a wavelength filter adapted to filter a predetermined wavelength band out of the wavelength spectrum.

10. An apparatus for extreme-ultraviolet (EUV) lithography comprising
    a projection objective adapted to operate in the EUV; and
    an arrangement for characterising the polarisation properties of the projection objective;
    wherein the arrangement comprises the generator and the detector as claimed in claim 1; and
    wherein the optical system comprises the projection objective.

11. An arrangement for characterising the polarisation properties of an optical system, comprising:
    at least one polarisation state generator which sets a defined polarisation state of radiation incident on the optical system; and
    a polarisation state detector adapted to measure the exit polarisation state of radiation issuing from the optical system;
    wherein the optical system is designed for a working wavelength of less than 15 nm;
    wherein at least one of the polarisation state generator and/or the polarisation state detector are so designed that its polarisation-optical action on an incident light beam is substantially constant over an angle spectrum of the light beam of at least 10°, wherein the angle spectrum comprises a spectrum of angles between diverging beam portions of the incident beam;
    wherein the at least one of the polarisation state generator and/or the polarisation state detector has at least one of a rotatable polariser and/or a rotatable retarder; and
    wherein the at least one of the rotatable polariser and/or the rotatable retarder has a plurality of substrates which are each provided with a respective multi-layer system.

12. The arrangement as claimed in claim 11, wherein at least two of the substrates are arranged tilted relative to each other.

13. The arrangement as claimed in claim 11, wherein at least one of the polarisation state generator and/or the polarisation state detector comprises the rotatable polariser and wherein the rotatable polariser produces a linear exit polarisation degree of radiation issuing from the rotatable polariser of at least 95%.

14. The arrangement as claimed in claim 11, wherein at least one of the polarisation state generator and/or the polarisation state detector comprises the rotatable retarder and wherein the rotatable retarder produces a retardation for radiation passing through the retarder of lambda/4+40%, wherein lambda is the working wavelength of the optical system.

15. The arrangement as claimed in claim 11, further comprising a light source outputting a spectrum of wavelengths of light including the light beam and a wavelength filter adapted to filter a predetermined wavelength band out of the wavelength spectrum.

16. The arrangement as claimed in claim 11, wherein the optical system is designed for a numerical aperture of at least 0.7.

17. The arrangement as claimed in claim 11, wherein the optical system outputs radiation over a given angle spectrum and the polarisation state detector is adapted to simultaneously measure the exit polarisation state of radiation issuing from the optical system over at least 50% of the angle spectrum of the radiation.

18. The arrangement as claimed in claim 11, wherein the optical system has at least one mirror.

19. An apparatus for extreme-ultraviolet (EUV) lithography comprising
a projection objective adapted to operate in the EUV; and
an arrangement for characterising the polarisation properties of the projection objective;
wherein the arrangement comprises the generator and the detector as claimed in claim 11; and
wherein the optical system comprises the projection objective.

20. A method of characterising the polarisation properties of an optical system, wherein the method comprises:
setting a defined polarisation state of radiation incident on the optical system with a polarisation state generator; and
measuring in pupil-resolved relationship an exit polarisation state of radiation issuing from the optical system with a polarisation state detector;
wherein the optical system is designed for a working wavelength of less than 15 nm; and
wherein at least one of the polarisation state generator and/or the polarisation state detector has at least one optical element operated in transmission mode;
wherein a light entrance surface of at least one of the polarisation state generator and/or the polarisation state detector is curved at least in regions along the surface such that an angle of incidence of a light beam on the surface is substantially constant for an angle spectrum of the light beam of at least 10°.

21. The method as claimed in claim 20, further comprising: effecting the measurement of the exit polarisation state simultaneously over the entire exit pupil of the optical system.

22. An arrangement for characterising the polarisation properties of an optical system, comprising:
at least one polarisation state generator which sets a defined polarisation state of radiation incident on the optical system; and
a polarisation state detector adapted to measure the exit polarisation state of radiation issuing from the optical system;
wherein the optical system is designed for a working wavelength of less than 15 nm;
wherein at least one of the polarisation state generator and/or the polarisation state detector is so designed that its polarisation-optical action on an incident light beam is substantially constant over an angle spectrum of the light beam of at least 10°, wherein the angle spectrum comprises a spectrum of angles between diverging beam portions of the incident beam;
wherein the at least one of the polarisation state generator and/or the polarisation state detector has at least one of a rotatable polariser and/or a rotatable retarder;
wherein the at least one of the rotatable polariser and/or the rotatable retarder has at least one multi-layer system having a plurality of individual layers;
wherein the multi-layer system has a light entrance surface which is curved at least in regions along the surface; and
wherein the multi-layer system varies in thickness along the surface.

23. An arrangement for characterising the polarisation properties of an optical system, comprising:
at least one polarisation state generator which sets a defined polarisation state of radiation incident on the optical system; and
a polarisation state detector adapted to measure the exit polarisation state of radiation issuing from the optical system;
wherein the optical system is designed for a working wavelength of less than 15 nm;
wherein at least one of the polarisation state generator and/or the polarisation state detector is so designed that its polarisation-optical action on an incident light beam is substantially constant over an angle spectrum of the light beam of at least 10°, wherein the angle spectrum comprises a spectrum of angles between diverging beam portions of the incident beam;
wherein the at least one of the polarisation state generator and/or the polarisation state detector has at least one of a rotatable polariser and/or a rotatable retarder;
wherein the at least one of the rotatable polariser and/or the rotatable retarder has at least one multi-layer system having a plurality of individual layers;
wherein the multi-layer system has a light entrance surface which is curved at least in regions along the surface; and
wherein at least one of the rotatable polariser and/or the rotatable retarder has a plurality of substrates which are each provided with a respective multi-layer system.

* * * * *